US008107313B2

(12) United States Patent
Kobayashi

(10) Patent No.: US 8,107,313 B2

(45) Date of Patent: Jan. 31, 2012

(54) SEMICONDUCTOR MEMORY AND MEMORY SYSTEM

(75) Inventor: Hiroyuki Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 686 days.

(21) Appl. No.: 12/238,900

(22) Filed: Sep. 26, 2008

(65) Prior Publication Data

US 2009/0019242 A1 Jan. 15, 2009

Related U.S. Application Data

(63) Continuation of application No. PCT/JP2006/306642, filed on Mar. 30, 2006.

(51) Int. Cl.
*G06F 12/00* (2006.01)

(52) U.S. Cl. ......... 365/230.06; 365/230.03; 365/230.04; 365/230.08; 711/156; 711/E12.001

(58) Field of Classification Search ............. 365/230.06, 365/230.04, 230.03, 230.08, 189.05, 189.07, 365/222, 238.5; 711/156, E12.001
See application file for complete search history.

(56) References Cited

U.S. PATENT DOCUMENTS

| | | | | |
|---|---|---|---|---|
| 5,631,873 | A | 5/1997 | Furutani | |
| 5,970,019 | A | 10/1999 | Suzuki et al. | |
| 6,191,999 | B1 | 2/2001 | Fujieda et al. | |
| 6,868,034 | B2 * | 3/2005 | La et al. | 365/238.5 |
| 2002/0031035 | A1 | 3/2002 | Tsuji et al. | |
| 2002/0114205 | A1 | 8/2002 | Tsuruda et al. | |
| 2003/0088753 | A1 | 5/2003 | Ikeda et al. | |
| 2003/0112694 | A1 | 6/2003 | Lee | |
| 2004/0095835 | A1 | 5/2004 | La et al. | |
| 2005/0185497 | A1 | 8/2005 | Ikeda et al. | |

FOREIGN PATENT DOCUMENTS

| | | | |
|---|---|---|---|
| JP | 8-321173 | A | 12/1996 |
| JP | 11-17137 | A | 1/1999 |
| JP | 11-25669 | A | 1/1999 |
| JP | 2002-93159 | A | 3/2002 |
| JP | 2002-245780 | A | 8/2002 |
| JP | 203-151272 | A | 5/2003 |
| JP | 2003-151272 | A | 5/2003 |
| JP | 2003-151273 | A | 5/2003 |
| JP | 2003-217279 | A | 7/2003 |
| JP | 2004-171753 | A | 6/2004 |
| JP | 2004-199795 | A | 7/2004 |
| WO | WO 2005/004164 | A1 | 1/2005 |

* cited by examiner

*Primary Examiner* — Alexander Sofocleous
*Assistant Examiner* — Hai Pham
(74) *Attorney, Agent, or Firm* — Arent Fox, LLP

(57) ABSTRACT

A plurality of cell arrays are assigned different addresses. An access information unit holds access enable information indicating the number of the cell arrays to be simultaneously activated. An array control unit activates at least one of the cell arrays corresponding to the access enable information, in response to an access request, and forcibly activates at least one of the cell arrays not corresponding to the access enable information, in response to a forced access request. Consequently, it is possible to activate the inactivated cell array not corresponding to the access enable information before the supply of the access request. Therefore, even when the number of the cell arrays to be simultaneously activated is small, it is possible to execute access operations without interruption. As a result, it is possible to access the cell arrays with minimum power consumption without lowering access efficiency.

13 Claims, 11 Drawing Sheets

SEMICONDUCTOR MEMORY AND MEMORY SYSTEM

CROSS-REFERENCE TO RELATED APPLICATION

This application is a Continuation Application of International Application No. PCT/JP2006/306642, filed Mar. 30, 2006, designating the U.S., the entire contents of which are incorporated herein by reference.

BACKGROUND

1. Field

The present embodiments relate to a semiconductor memory whose address space can be changed in size.

2. Description of the Related Art

If the semiconductor memories mounted on the system have a useless memory area which is not accessed, the cost of the system increases and power is wastefully consumed. The related art is disclosed in Japanese Laid-open Patent Publication No. 2002-245780.

SUMMARY

According to one aspect of an embodiment, semiconductor memory is provided which includes a plurality of cell arrays that includes memory cells and assigned different addresses, an access information unit that stores access enable information indicating a number of the cell arrays to be simultaneously activated, and an array control unit that activates at least one of the cell arrays corresponding to the access enable information set in the access information unit, in response to an access request, and forcibly activates at least one of the cell arrays not corresponding to the access enable information set in the access information unit, in response to a forced access request.

DETAILED DESCRIPTION OF THE EMBODIMENTS

Figure 1:
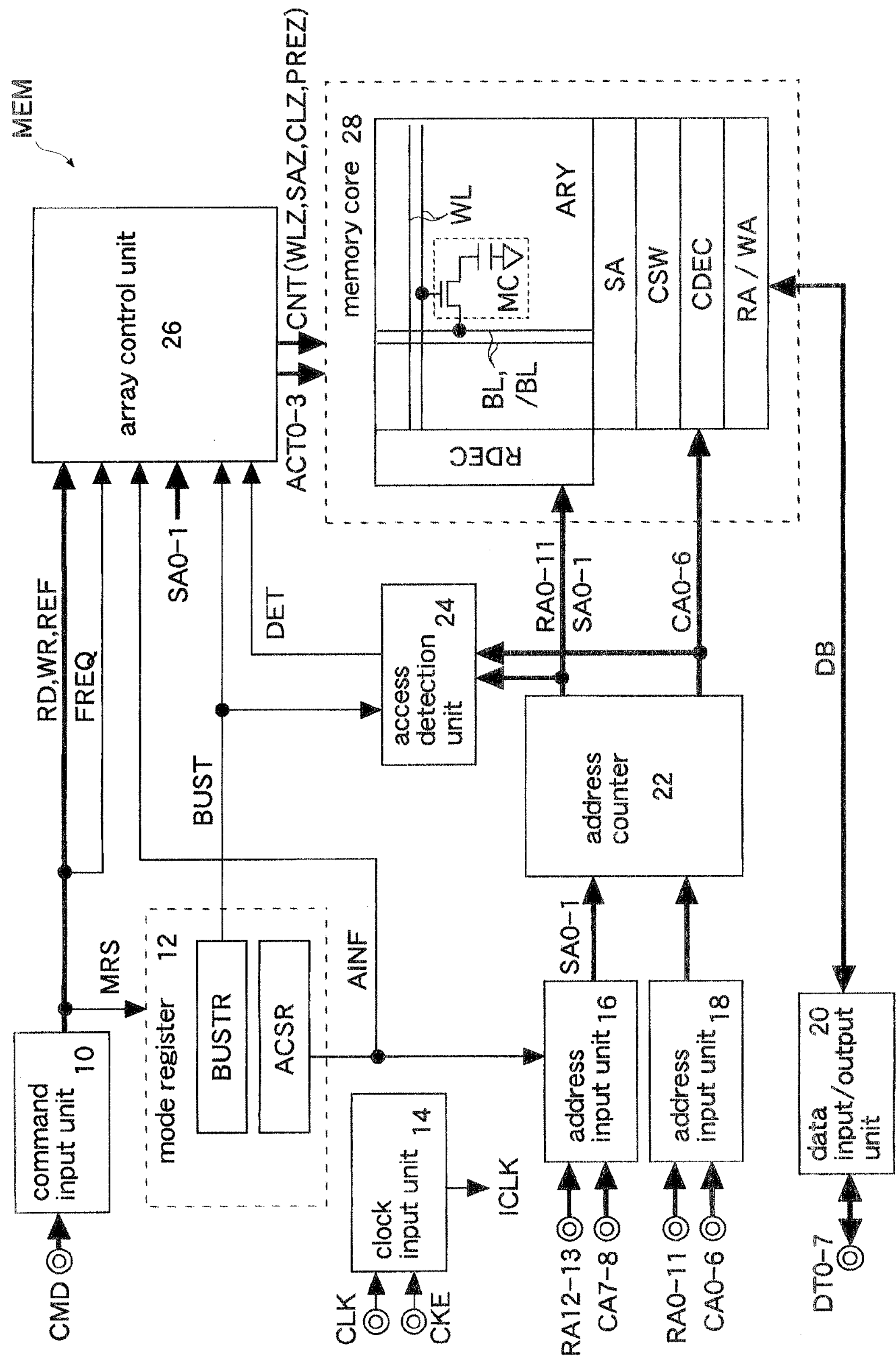
FIG. 1 illustrates a first embodiment.

In the drawings, each signal line represented by the heavy line is made up of a plurality of lines. Further, some of blocks to which the heavy lines are coupled are made up of a plurality of circuits. Each signal line through which a signal is transmitted is denoted by the same reference numeral or symbol as the signal name. Each double circle in the drawings represents an external terminal.

FIG. 1 illustrates a semiconductor memory of a first embodiment. The semiconductor memory MEM is, for example, an SDRAM operating in synchronization with a clock CLK and having dynamic memory cells. The memory MEM has a command input unit 10, a mode register 12, a clock input unit 14, address input units 16, 18, a data input/output unit 20, an address counter 22, an access detection unit 24, an array control unit 26, and a memory core 28.

The command input unit 10 receives a command CMD supplied to a command terminal CMD to output the received command CMD to the array control unit 26. In this embodiment, access commands (a read command and a write command, a refresh command), a register set command, a forced access command (a forced access request), and a forced access release command are supplied as the command CMD to the command input unit 10. The read command and the write command are supplied with addresses RA, CA when an access operation (a read access operation and a write access operation) of memory cells MC of a memory cell array ARY is to be executed. The refresh command is supplied when a refresh operation of the memory cells MC is to be executed. The command input unit 10 keeps a forced access request signal FREQ active during a period from the receipt of the forced access command to the receipt of the forced access release command.

The forced access command and the forced access release command are commands supplied to the memory MEM only when logic 1 is held in later—described access enable information AINF of an access register ACSR. The forced access command and the forced access release command are supplied with a row address RA12-13. At this time, the row address RA12-13 indicates sub-cell arrays SARY0-3 to be activated for forced access or the sub-cell arrays SARY0-3 to be inactivated for stopping the forced access. Since the forced access command is received by the command input unit 10, it is possible to forcibly activate the inactivated sub-cell array SARY without providing any special terminal. That is, as will be described later, the sub-cell arrays SARY in number not corresponding to the access enable information AINF can be activated.

The mode register 12 has a burst register BUSTR and the access register ACSR. The mode register 12 has, in addition to the shown elements, a latency register for deciding CAS latency, and so on. The CAS latency represents the number of clock cycles in a period from the receipt of the read command to the output of read data.

The burst register BUSTR holds burst length. The burst length represents the number of data signals input/output in response to one read command or one write command. For example, "1", "4", "8", and "full burst" are the kinds of the burst length. The full burst represents a mode where, after the supply of the read command or the write command, the data output or input is continued until a subsequent command is supplied. The mode register 12 activates a burst signal BUST when the kind of the burst length set in the burst register BUSTR is "4", "8", or "full burst". The later-described array control unit 26 operates in a burst access mode while the bust signal BUST is active.

Figure 2:
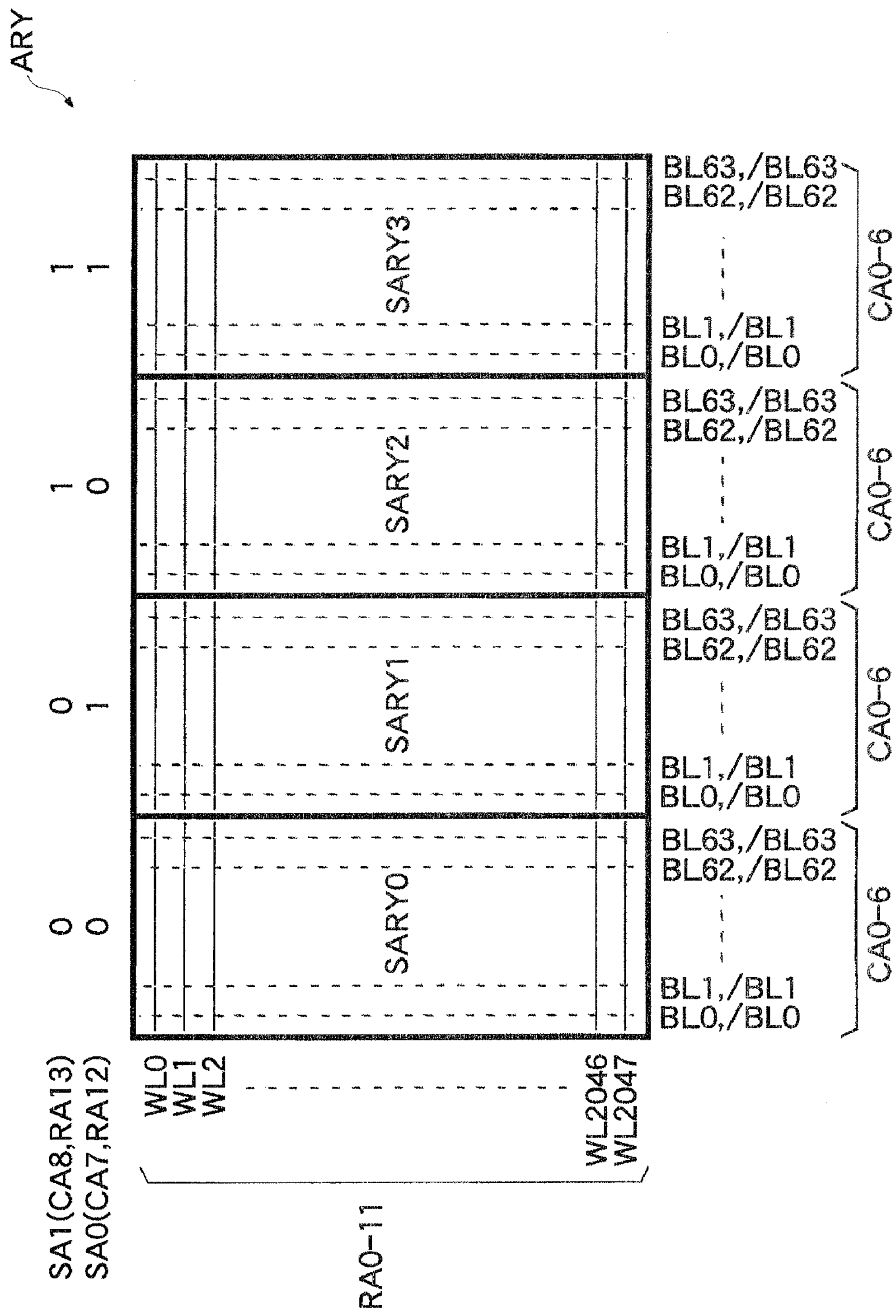
FIG. 2 illustrates a cell array in FIG. 1.

The access register ACSR holds the access enable information AINF indicating whether to activate the sub-cell arrays SARY0-3 illustrated in FIG. 2 simultaneously or one by one, and outputs the held access enable information AINF as an access enable signal AINF.

In this example, when the access enable information AINF and the access enable signal AINF have low level (logic 0), all the sub-cell arrays SARY0-3 are simultaneously activated. When the access enable information AINF and the access enable signal AINF have high level (logic 1), one of the sub-cell arrays SARY0-3 is activated and the others of the sub-cell arrays SARY0-3 are not activated in a regular access operation. The access register ACSR functions as an access information unit in which the access enable information indicating the number of the sub-cell arrays SARY0-3 to be activated simultaneously is set.

The mode register 12 is set according to bit values of the addresses RA, CA supplied with a register set command MRS. Consequently, it is possible to rewritably set the access enable information AINF indicating the number of the sub-cell arrays SARY to be activated simultaneously, without providing any special terminal. Incidentally, the mode register 12 may be set according to a bit value of data DT, or may be set according to the bit values of the addresses RA, CA and the data DT. By setting the burst register BUSTR and the access register ACSR using a plurality of terminals, it is possible to reduce the cycle time necessary for the setting to a minimum. As a result, it is possible to prevent the deterioration in access efficiency of a read access or a write access to the memory cell array ARY.

The clock input unit 14 outputs the external clock CLI (as an internal clock ICLI (while a clock enable signal CKE is active, and stops the generation of the internal clock ICLK while the clock enable signal CKE is inactive. The internal clock ICLK is supplied in order to operate circuit blocks except the clock input unit 14 of the memory MEM.

The address input unit 16 receives the row address RA12-13 and a column address CA7-8 which are supplied to an address terminal AD. The address input unit 16 outputs the received column address CA7-8 as an array selection address SA0-1 while receiving the access enable signal AINF with low level, and outputs the received row address RA12-13 as the array selection address SA0-1 while receiving the access enable signal AINF with high level. The array selection address SA0-1 is used for selecting one of the sub-cell arrays SARY0-3 illustrated in FIG. 2.

The address input unit 18 receives a row address RA0-11 and a column address CA0-6 supplied to an address terminal AD, and outputs the received addresses RA0-11, CA0-6 to the address counter 22. The row address RA0-11 is used for selecting a later-described word line WL. The column address CA0-6 is used for selecting later-described bit line pairs BL, /BL. In this embodiment, the row addresses RA and the column addresses CA are supplied simultaneously to dedicated address terminals RA, CA respectively. That is, this memory MEM adopts an address non-multiplexed method.

The data input/output unit 20 outputs, to a data terminal DT (DT0-7), read data which is output from the memory core 28 via a data bus DB during a read operation, and it outputs write data, which is received at the data terminal DT during a write operation, to the memory core 28 via the data bus DB. The data terminal DT is a terminal common to the read data and the write data.

The address counter 22 outputs the received addresses RA0-11, CA0-6, SA0-1 as they are when the burst length set in the burst register BUSTR is "1". When the burst length set in the burst register BUSTR is "4", "8", or "full burst", the address counter 22 sequentially generates the CA0-6, SA0-1 (internal addresses) subsequent to the received addresses CA0-6, SA0-1 (external access addresses), in number corresponding to the burst length and outputs them. Incidentally, the address counter 22 may sequentially increment the row address RA0-11 as well.

The access detection unit 24 operates only when the logic 1 is held in the access enable information AINF of the access register ACSR. During the burst access mode, the access detection unit 24 monitors the access addresses CA0-6, SA0-1 output from the address counter 22, and when detecting in advance that the execution of the access to the sub-cell array SARY (for example, SARY0) activated in response to the access command will be followed by the execution of the access to another sub-cell array SARY (for example, SARY 1), the access detection unit 24 activates a detection signal DET. The operation of the access detection unit 24 will be described later with reference to FIG. 5.

The array control unit 26 outputs a control signal CNT based on which the memory cell array ARY is accessed in response to the access command CMD, in order to execute the access operation to the memory core 28. The control signal CNT includes a word line control signal WLZ for selecting a word line WL, a sense amplifier control signal SAZ for activating a sense amplifier SA, a column line control signal CLZ for selecting a column switch, and a precharge control signal PREZ for precharging bit lines BL, /BL.

Further, the array control unit 26 activates all activation signals ACT0-3 when receiving the access enable signal AINF with low level. When receiving the access enable signal AINF with high level, the array control unit 26 activates one of the activation signals ACT0-3 in order to activate only one of the sub-cell arrays SARY0-3 selected according to the array selection address SA0-1. In response to the activation of the activation signals ACT0-3, the sub-cell arrays SARY0-3 are activated respectively. That is, according to the access enable information AINF, the array control unit 26 activates all the sub-cell arrays SARY0-3 or activates one of the sub-cell arrays SARY0-3, in response to the access command. When information indicating that the sub-cell arrays SARY0-3 should be activated one by one is held in the access enable information AINF of the access register ACSR, only one of the sub-cell arrays SARY0-3 is activated according to the array selection address SA0-1, and as a result, power consumption can be reduced.

During a high-level period of the access enable signal AINF, in response to the activation of the forced access request signal FREQ, the array control unit 26 forcibly activates the activation signal ACT corresponding to the sub-cell array SARY indicated by the row address RA12-13 (=the array selection address SA0-1) supplied with the forced access command. That is, the array control unit 26 forcibly activates the sub-cell array SARY not corresponding to the access enable information AINF set in the access register ACSR, in response to the forced access request FREQ. This eliminates a need for interrupting the access operation in order to rewrite the access enable information AINF. As a result, it is possible to access the cell arrays with minimum power consumption without lowering access efficiency.

Further, when receiving the active detection signal DET while the burst signal BUST is active (during the burst access mode), the array control unit 26 not only activates the sub-cell array SARY (for example, SARY0) which is currently activated for the execution of the access operation, but also forcibly activates another sub-cell array SARY (for example, SARY1). This makes it possible to execute the access operations without interruption when the access operations are executed for the two sub-cell arrays SARY in sequence during the burst access mode.

The memory core 28 has the memory cell array ARY, a row decoder RDEC, the sense amplifier SA, a column switch CSW, a column decoder CDEC, a read amplifier RA, and a write amplifier WA. The memory cell array ARY has the dynamic memory cells MC and the word lines WL and bit line pairs BL, /BL which are coupled to the dynamic memory cells MC. The memory cells MC are formed at positions where the word lines WL and the bit line pairs BL, /BL intersect with each other.

The row decoder RDEC decodes the row address RA in response to the access command and the refresh command to select one of the word lines WL. The column decoder CDEC decodes the column address CA in response to the access command to select eight sets of the bit line pair BL, /BL corresponding to the number of bits of the data terminal DT.

The sense amplifier SA amplifies a difference in signal amount between data signals read to each of the bit line pairs BL, /BL. The column switch CSW couples the bit line pairs BL, /BL to the data bus line DB according to the column address CA. During the read operation, the read amplifier RA amplifiers complementary read data output via the column switch CSW. During the write operation, the write amplifier WA amplifies complementary write data supplied via the data bus DB to supply the resultant data to the bit line pairs BL, /BL.

FIG. 2 illustrates the memory cell array ARY illustrated in FIG. 1. In FIG. 2, for example, the memory cell array ARY corresponding to the data terminal DT0 is illustrated. Actually, the bit line pairs BL, /BL are provided in correspondence to the data terminals DT0-7 respectively.

The memory cell array ARY has the four sub-cell arrays SARY0-3. The sub-cell arrays SARY0-3 have the same memory capacity and are selected according to the array selection address SA0-1. That is, the sub-cell arrays SARY0-3 are assigned different addresses. As described above, the array selection address SA0-1 is supplied as the column address CA7-8 when the access enable information AINF with low level is set in the access register ACSR, and is supplied as the row address RA12-13 when the access enable information AINF with high level is set in the access register ACSR.

When the access enable information AINF with low level is set in the access register ACSR, all the sub-cell arrays SARY0-3 are simultaneously activated in response to the access command. For example, when the array selection address SA0-1 has a value "11" and accordingly the sub-cell array SARY3 is accessed (for example, the word line WL2), the word lines WL2 of the other sub-cell arrays SARY1-2 are activated as well in synchronization with the activation of the sub-cell array SARY3.

On the other hand, when the access enable information AINF with high level is set in the access register ACSR, only one of the sub-cell arrays SARY0-3 corresponding to the array selection address SA0-1 is activated in response to the access command. For example, when the array selection address SA0-1 has a value "00" and accordingly the sub-cell array SARY0 is accessed (for example, the word line WL1), the word lines WL1 of the other sub-cell arrays SARY1-3 are not activated.

Figure 3:
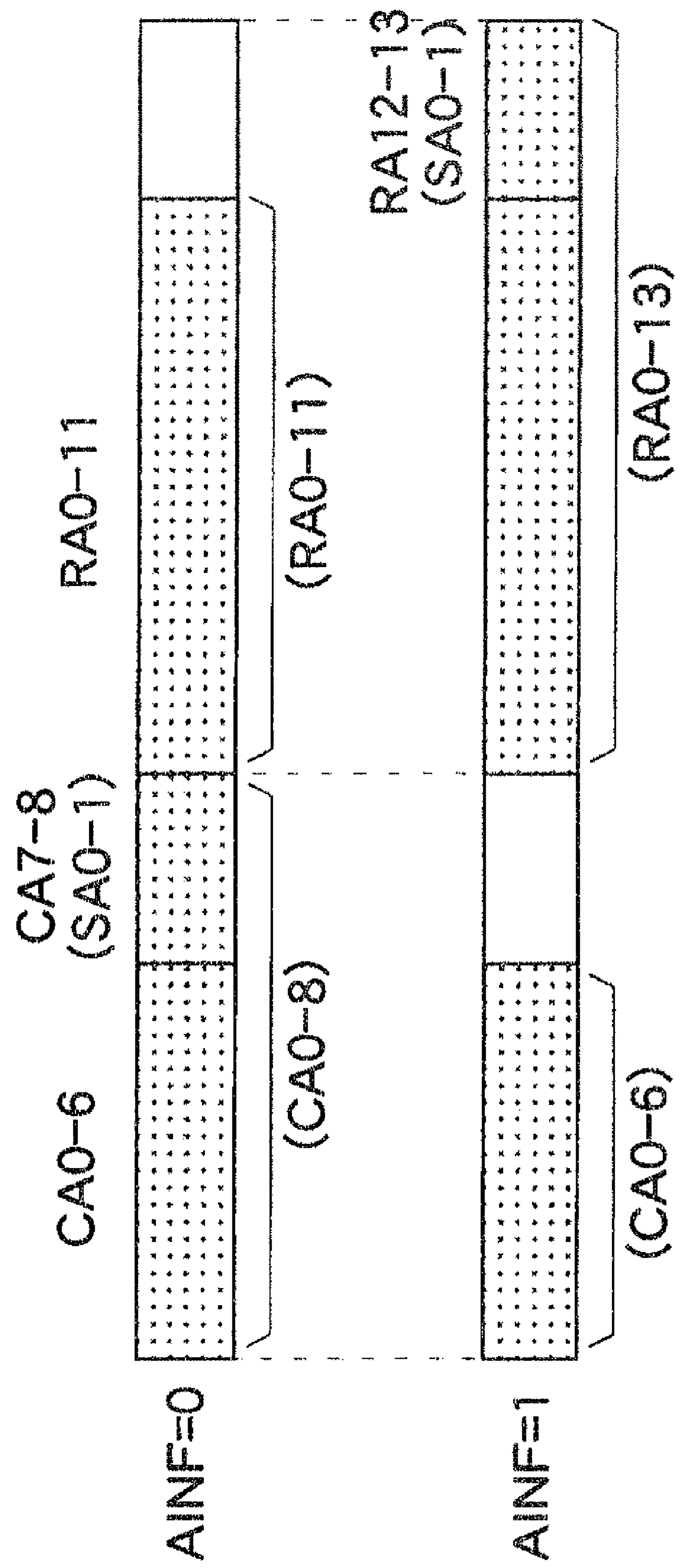
FIG. 3 illustrates address assignment.

FIG. 3 illustrates address assignment according to the contents set in the access register ACSR illustrated in FIG. 1. When logic 0 (low level) is set in the access enable information AINF, the column address CA7-8 is supplied as the address selection address SA0-1 to the memory core 28. At this time, the sub-cell arrays SARY0-3 are selected according to the column address CA7-8. Therefore, in the access operation, all the sub-cell arrays SARY0-3 are activated.

When logic 1 (high level) is set in the access enable information AINF, the row address RA12-13 is supplied as the array selection address SA0-1 to the memory core 28. At this time, one of the sub-cell arrays SARY0-3 is selected according to the row address RA12-13. Therefore, in the access operation, one of the sub-cell arrays SARY0-3 corresponding to the row address RA12-13 is activated.

Figure 4:
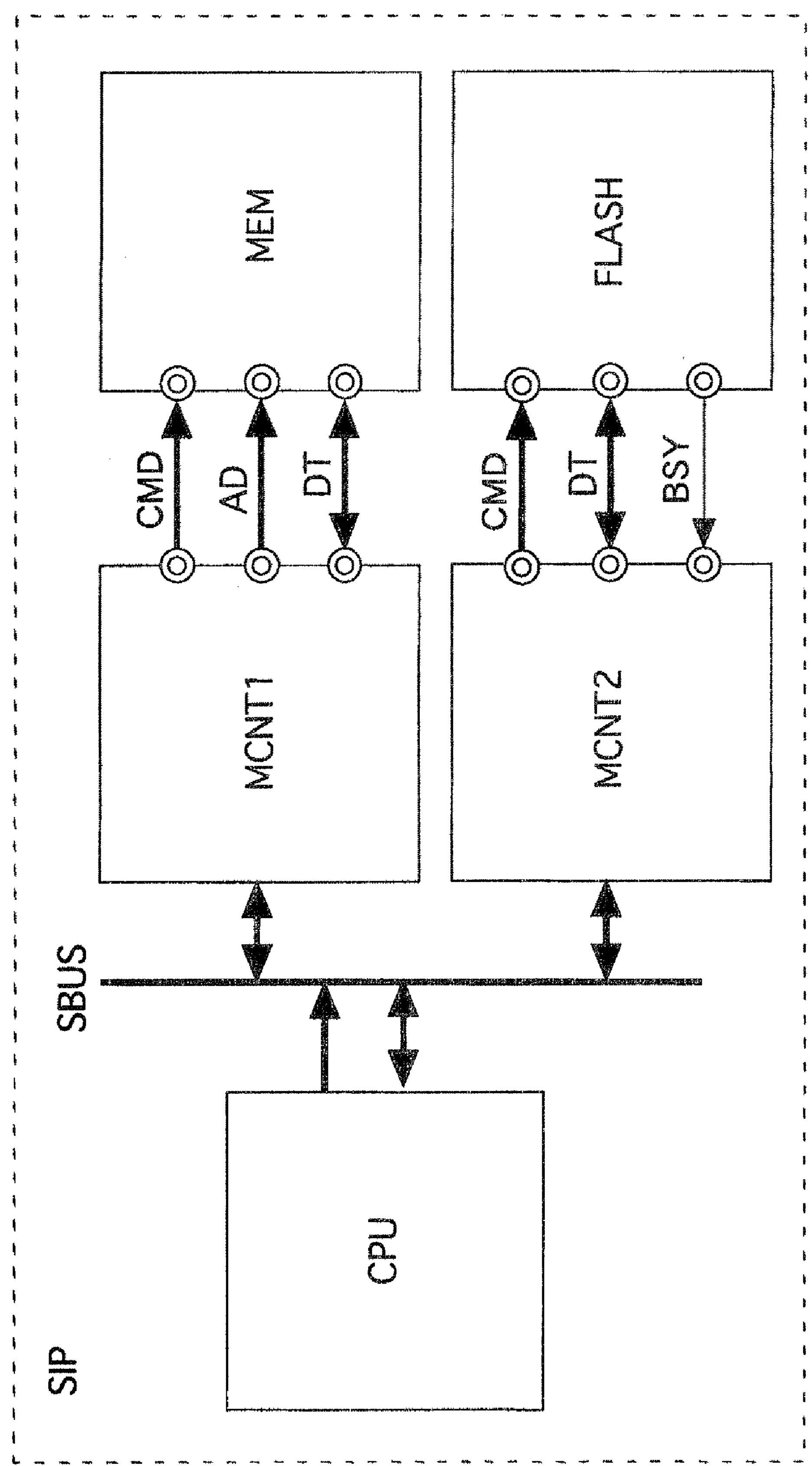
FIG. 4 illustrates a memory system.

FIG. 4 illustrates a memory system on which the memory MEM illustrated in FIG. 1 is mounted. The memory system is formed as a SIP (System In Package) integrated on a substrate. The SIP has the memory MEM illustrated in FIG. 1, a memory controller MCNT1 accessing the memory MEM, a flash memory FLASH, a memory controller MCNT2 accessing the flash memory FLASH, and a CPU controlling the whole system. The CPU and the memory controllers MCNT1-2 are coupled to each other via a system bus SBUS. In order to access the memory MEM, the CPU outputs the access command CMD, an external address AD, and write data DT, and receives read data DT from the memory MEM via the memory controller MCNT1.

Figure 5:
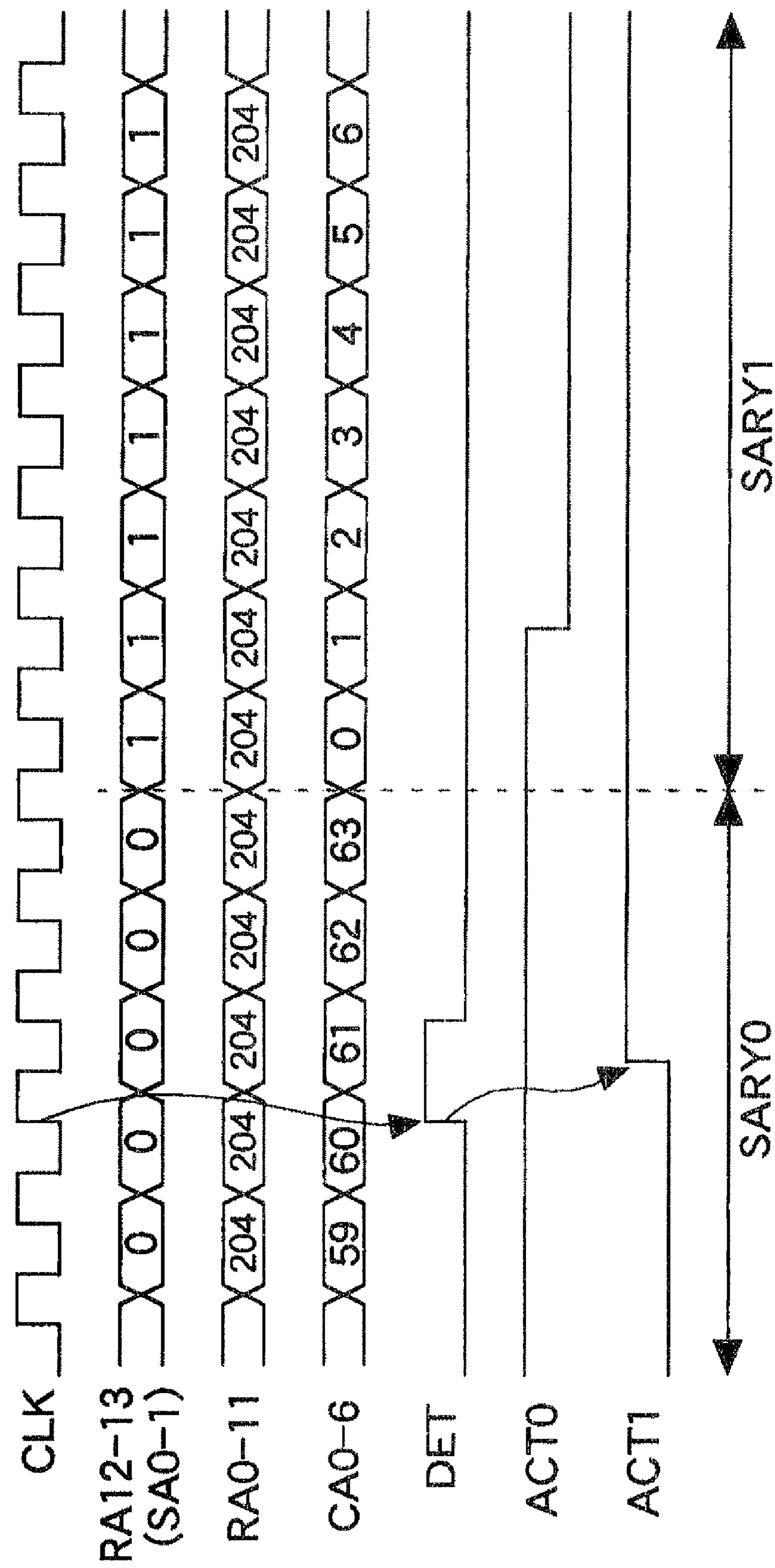
FIG. 5 illustrates a burst access operation in FIG. 1.

FIG. 5 illustrates a burst access operation when logic 1 is set in the access enable information AINF in the memory MEM illustrated in FIG. 1. In this example, a burst access operation of the sub-cell array SARY1 is executed following a burst access operation of the sub-cell array SARY0.

The sub-cell array SARY0 is selected when the row address RA12-13 has a value "0". In this example, "full burst" is set in the burst register BUSTR. Therefore, the column address CA0-6 is decimally incremented from "0" to "63" in sequence at every access. After one-round of the increment of the column address CA0-6, the sub-cell array SARY0 is inactivated and the sub-cell array SARY1 is activated while the row address RA0-1 (in this example, 2047) is held. Therefore, it is possible to sequentially access the plural sub-cell arrays SARY without increasing an activated area.

The access detection unit 24 illustrated in FIG. 1 activates the detection signal DET in synchronization with the fourth access (CA0-6=60) from the final access to the sub-cell array SARY0. In synchronization with the activation of the detection signal DET, the array control unit 26 activates the activation signal ACT1 in order to activate the sub-cell array SARY1. In response to the activation signal ACT1, the sub-cell array SARY1 activates generation circuits of power to be supplied to the row decoder RDCE (for example, a boost voltage generation circuit and a negative voltage generation circuit), generation circuits of power to be supplied to the sense amplifier SA (for example, a boost voltage generation circuit and a negative voltage generation circuit), and so on, while the final three access operations are under execution in the sub-cell array SARY0. Then, after the completion of the burst access operation of the sub-cell array SARY0, the operation of the sub-cell array SARY1 is started in the next cycle. That is, even in an operation mode where only one of the sub-cell arrays SARY is activated (AINF=high level) in order to reduce power consumption, the burst access operation is incessantly executed without being stopped during a switching period of the sub-cell arrays SARY0-1. Further, after the activation of the sub-cell array SARY1, the sub-cell array SARY0 whose burst access operation has been completed is inactivated (ACT0=low level). Therefore, it is possible to access the cell arrays with minimum power consumption without lowering access efficiency.

In the foregoing first embodiment, the sub-cell arrays SARY in number not corresponding to the access enable information AINF can be forcibly activated before the access command is supplied. Therefore, even when the number of the sub-cell arrays SARY simultaneously activated is small, it is possible to execute the access operations without interruption. Further, since there is no need to newly set the access enable information AINF, there is no need to interrupt the access operation in order to rewrite the access enable information AINF. As a result, it is possible to access the cell arrays with minimum power consumption without lowering access efficiency.

Further, when the access operation to the sub-cell array SARY to which access is not permitted is executed by the continuous access such as the burst access operation, the information to this effect is detected in advance by the access detection unit 24, which makes it possible to activate the sub-cell array SARY to be accessed next in good time. Therefore, it is possible to continuously execute the accesses without interruption. In particular, during the continuous accesses, such as the burst access operation, automatically executed in the memory MEM, the sub-cell array SARY to be accessed next is activated in advance to prevent the interruption of the accesses, which can facilitate the control of the controller accessing the memory MEM.

Figure 6:
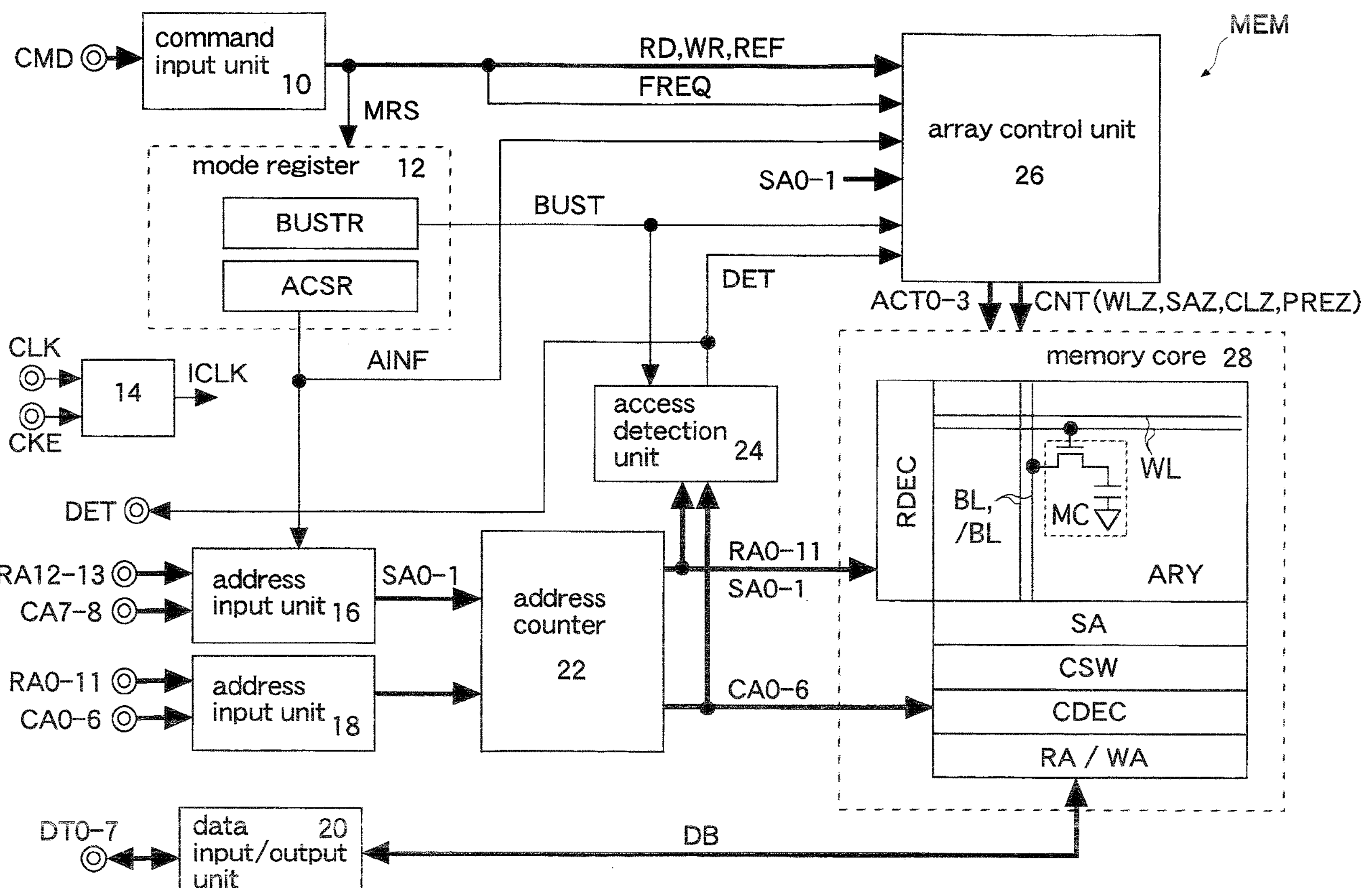
FIG. 6 illustrates a second embodiment.

FIG. 6 illustrates a semiconductor memory of a second embodiment. The same elements as the elements described in the first embodiment will be denoted by the same reference numerals and symbols and detailed description thereof will be omitted. The semiconductor memory MEM of this embodiment has a detection terminal DET outputting a detection signal DET output from an access detection unit 24, to an exterior of the memory MEM. The other structure is the same as that of the first embodiment. That is, the semiconductor memory MEM is formed as an SDRAM.

Figure 7:
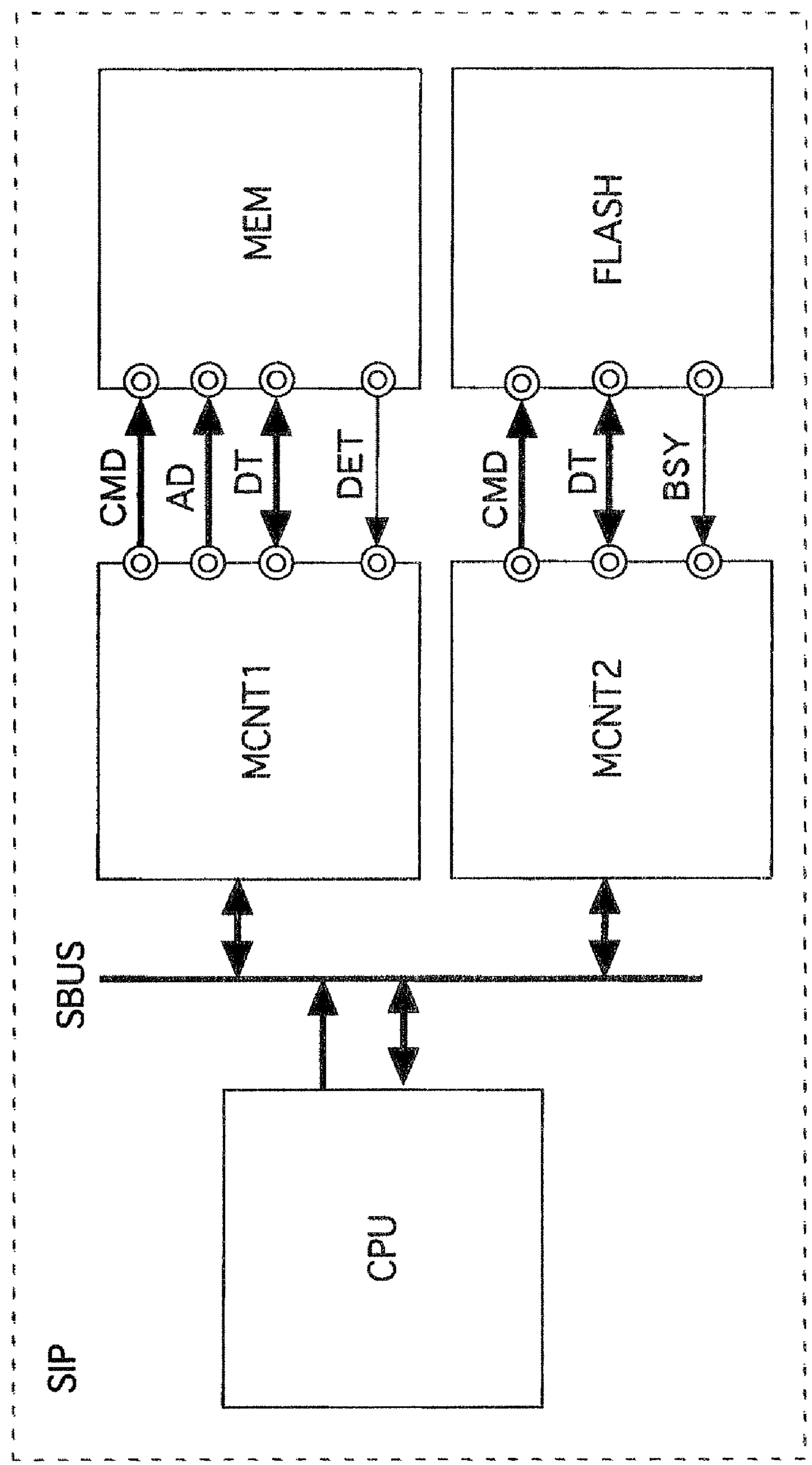
FIG. 7 illustrates a memory system.

FIG. 7 illustrates a memory system on which the memory MEM illustrated in FIG. 6 is mounted. This memory system is different from that of the first embodiment in that the detection signal DET is transmitted to a memory controller MCNT1 from the memory MEM.

The memory controller MCNT1 has a control unit CNT1 which determines whether to stop or continue access to the memory MEM in response to the activation of the detection signal DET indicating that an access operation of a sub-cell array SARY not corresponding to access enable information AINF is to be executed. The other structure is the same as that in FIG. 4.

For example, as illustrated in FIG. 5 described above, when, during a burst access mode, an access operation of a sub-cell array SARY to which access is not permitted is executed following an access operation of a sub-cell array SARY to which access is permitted, the memory controller MCNT1 accessing the memory MEM cannot recognize that the sub-cell array SARY to be activated is changed. At such an occasion, owing to the transmission of the detection signal DET to the memory controller MCNT1, the control unit CNT1 of the memory controller MCNT1 can determine, in response to the detection signal DET, whether to execute or stop the access operation of the sub-cell array SARY to which the access is not permitted.

For example, when the access operation of the sub-cell array not corresponding to the access enable information AINF is a malfunction, the memory controller MCNT1 stops the access operation. This can stop a useless access. When the access operation of the sub-cell array SARY not corresponding to the access enable information AINF is a normal operation, the memory controller MCNT1 continues the access operation.

The foregoing second embodiment can provide the same effects as those of the above-described first embodiment. In addition, in this embodiment, owing to the transmission of the detection signal DET to the memory controller MCNT1, the memory controller MCNT1 can determine whether to continue or stop the access. As a result, a useless access operation due to a malfunction or the like can be prevented, which makes it possible to access the cell arrays with minimum power consumption without lowering access efficiency.

Figure 8:
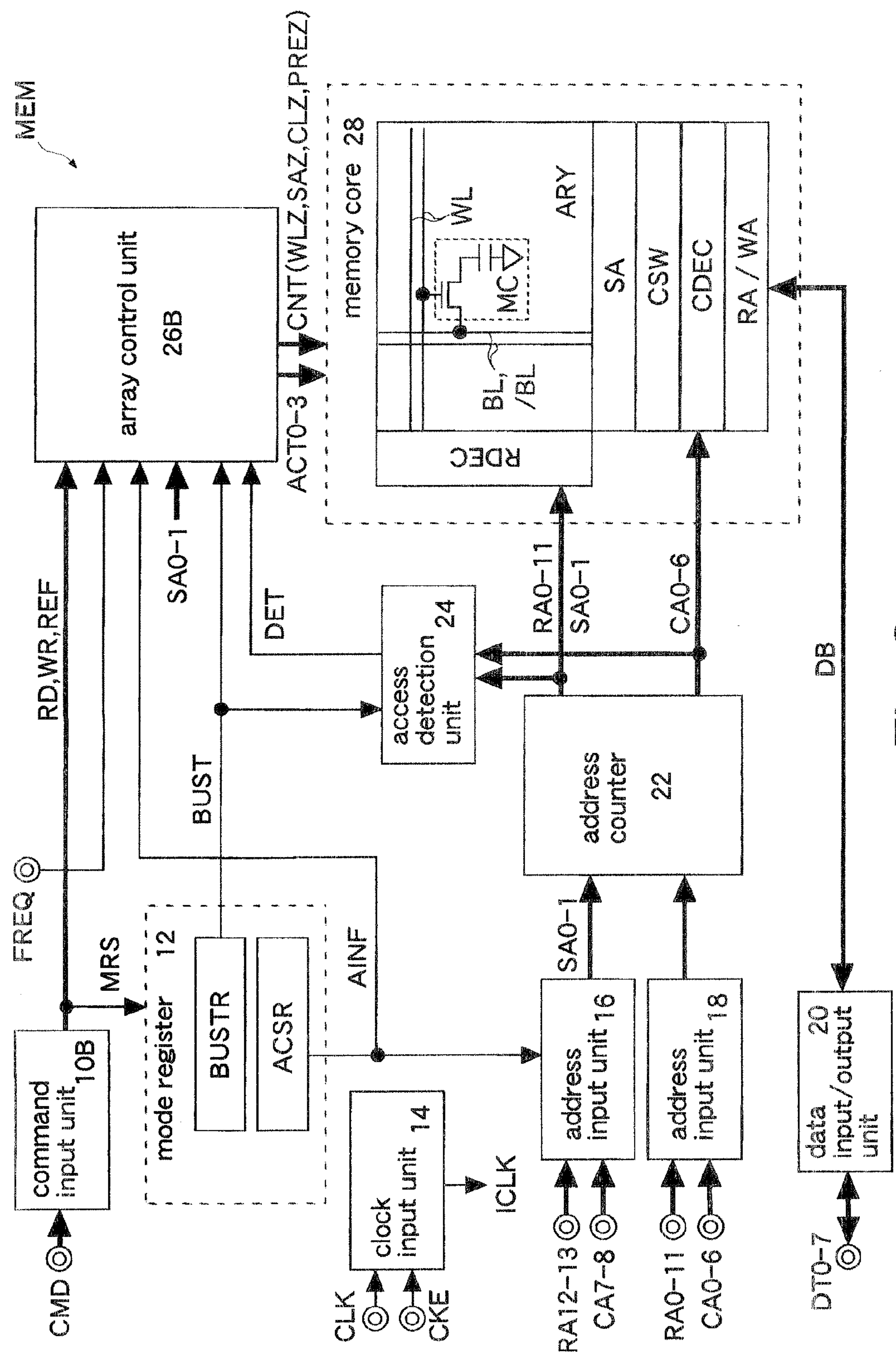
FIG. 8 illustrates a third embodiment.

FIG. 8 illustrates a semiconductor memory of a third embodiment. The same elements as the elements described in the first embodiment will be denoted by the same reference numerals and symbols and detailed description thereof will be omitted. The semiconductor memory MEM of this embodiment has a command input circuit 10B and an array control unit 26B in place of the command input circuit 10 and the array control unit 26 of the first embodiment. Further, the semiconductor memory MEM has a forced access request terminal FREQ dedicated to receiving a forced access request FREQ. The other structure is the same as that of the first embodiment. That is, the semiconductor memory MEM is formed as a SDRAM.

The array control unit 26B forcibly activates activation signals ACT0-3 corresponding to all sub-cell arrays SARY0-3 in response to the forced access request FREQ received at the forced access request terminal FREQ. That is, in response to the forced access request FREQ, the array control unit 26B forcibly activates a sub-cell array SARY not corresponding to access enable information AINF set in an access register ACSR.

In this embodiment, it is not necessary to designate the sub-cell array SARY to be activated when the forced access request FREQ is sent, and therefore, a memory controller MCNT1 can supply the forced access request FREQ at any timing without following command input specifications. Since the forced access request FREQ can be supplied without using any of a command terminal CMD, address terminals RA0-13, CA0-8, and data terminals DT0-7, it is possible to activate the sub-cell array SARY to which an access operation is to be executed next, without interrupting the access operation.

Incidentally, the memory controller MCNT1 has a forced access request terminal FREQ, not specifically shown, outputting the forced access request FREQ, in place of the detection terminal DET receiving the detection signal DET illustrated in FIG. 7. The other structure of the memory system is the same as that in FIG. 7.

The foregoing third embodiment can provide the same effects as those of the above-described first embodiment. In addition, in this embodiment, it is possible to forcibly activate the sub-cell array SARY not corresponding to the access enable information AINF without using any of the terminals used for the regular access operation. As a result, it is possible to access the sub-cell arrays without lowering access efficiency.

Figure 9:
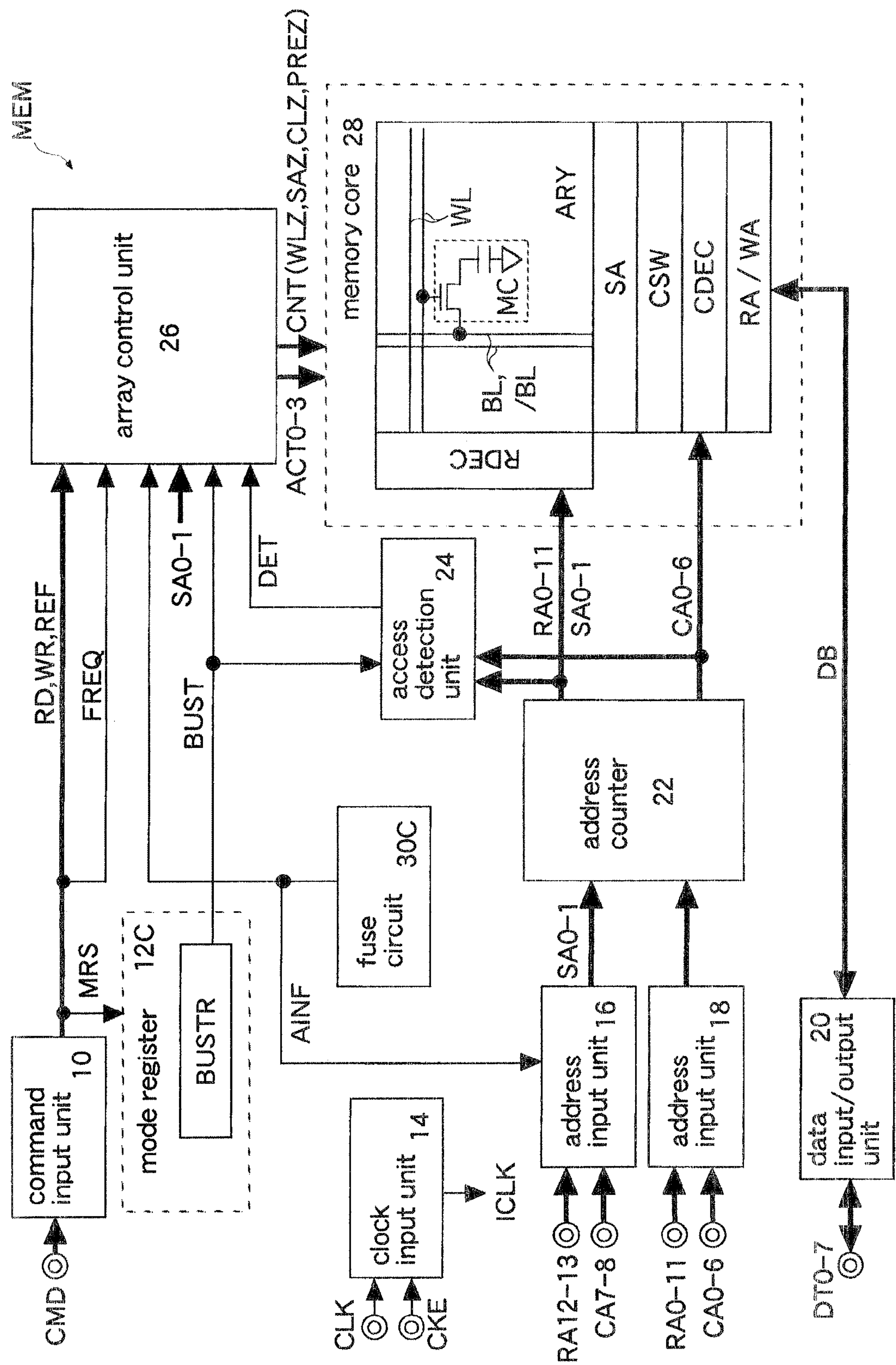
FIG. 9 illustrates a fourth embodiment.

FIG. 9 illustrates a semiconductor memory of a fourth embodiment. The same elements as those described in the first embodiment will be denoted by the same reference numerals and symbols and detailed description there of will be omitted. The semiconductor memory MEM of this embodiment has a mode register 12C in place of the mode register 12 of the first embodiment. Further, the semiconductor memory MEM newly has a fuse circuit 30C. The other structure is the same as that of the first embodiment. That is, the semiconductor memory MEM is formed as a SDRAM.

The mode register 12C has the same structure as the mode register 12 of the first embodiment except that it does not have the access register ACSR. An access enable signal AINF is output from the fuse circuit 30C. The fuse circuit 30C has a fuse in which access enable information AINF is programmed. That is, the fuse circuit 30C functions as an access information unit in which the access enable information AINF is set.

The foregoing fourth embodiment can provide the same effects as those of the above-descried first and second embodiments. In addition, even when the access enable information AINF is programmed in the fuse circuit 30C, it is possible to access a sub-cell array SARY to which access is not permitted, by using a forced access request FREQ.

Figure 10:
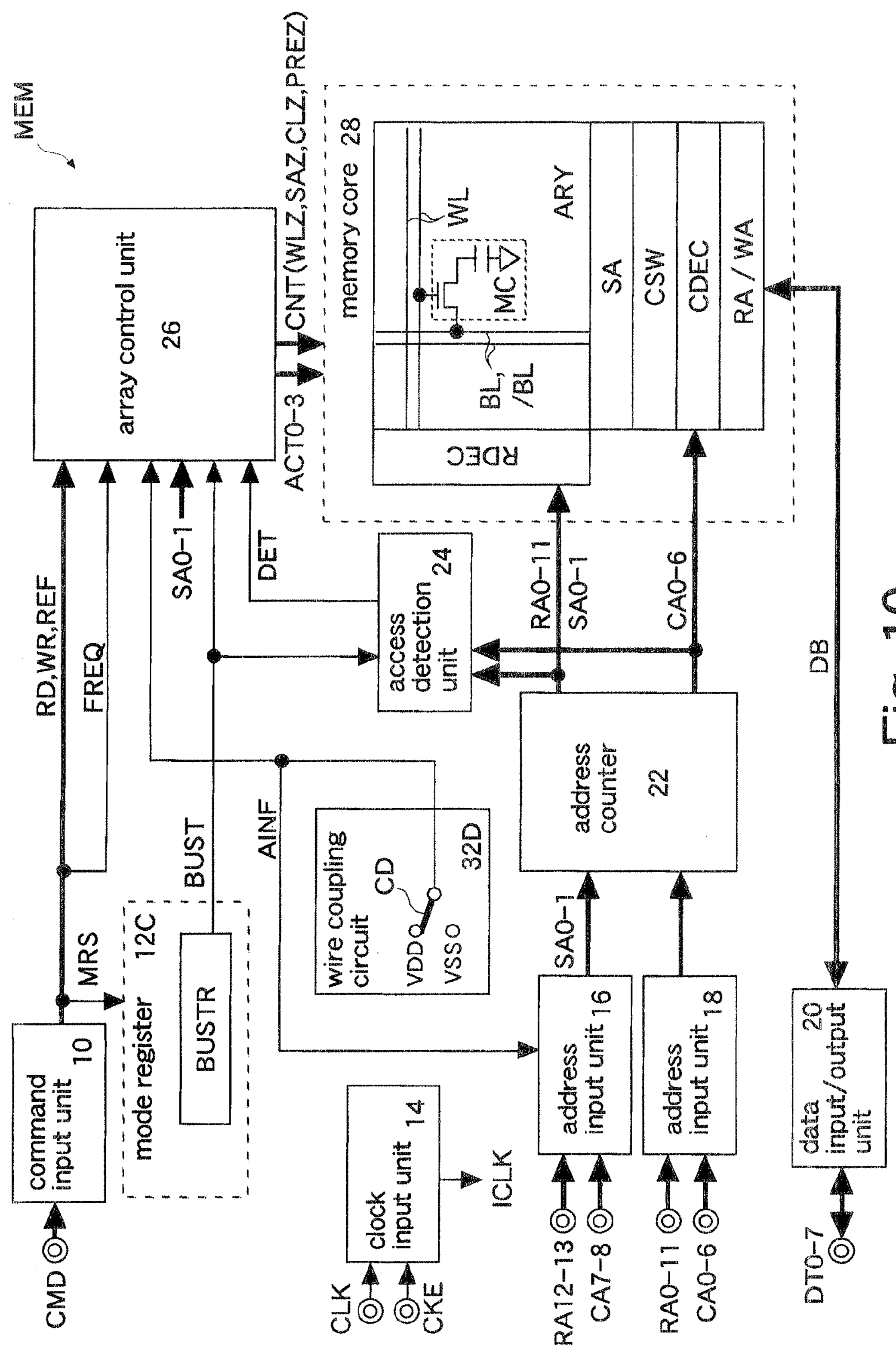
FIG. 10 illustrates a fifth embodiment.

FIG. 10 illustrates a semiconductor memory of a fifth embodiment. The same elements as those described in the first and fourth embodiments will be denoted by the same reference numerals and symbols and detailed description thereof will be omitted. The semiconductor memory MEM of this embodiment has the mode register 12C of the fourth embodiment in place of the mode register 12 of the first embodiment. Further, the semiconductor memory MEM additionally has a wire coupling circuit 32D. The other structure is the same as that of the first embodiment. That is, the semiconductor memory MEM is formed as a SDRAM.

The wire coupling circuit 32D is a switch including a conductive pattern CD which is formed on a substrate of the memory MEM so as to match a pattern shape of a host mask used in manufacturing processes of the memory MEM. The wire coupling circuit 32D stores access enable information AINF indicating the number of sub-cell arrays SARY to be simultaneously activated, according to a voltage value of a coupling destination of the conductive pattern CD. In this example, the conductive pattern CD is coupled to a power supply line VDD or a ground line VSS. That is, the wire coupling circuit 32D functions as an access information unit in which the access enable information AINF is set.

The foregoing fifth embodiment can provide the same effects as those of the above-descried first and second embodiments. In addition, even when the access enable information AINF is programmed according to a used host mask, it is possible to access the sub-cell array SARY to which access is not permitted, by using a forced access request FREQ.

Figure 11:
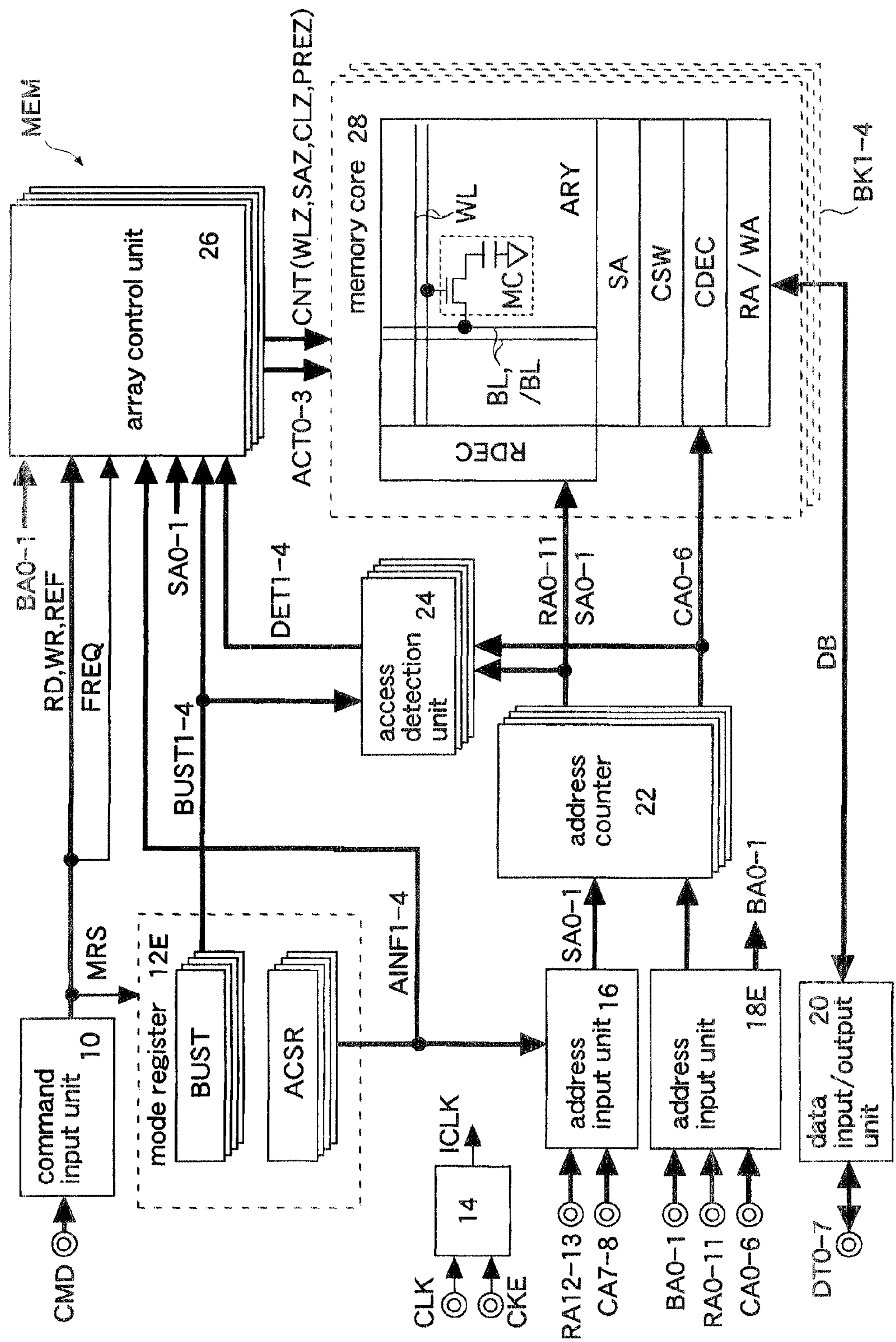
FIG. 11 illustrates a sixth embodiment.

FIG. 11 illustrates a semiconductor memory of a sixth embodiment. The same elements as those described in the first embodiment will be denoted by the same reference numerals and symbols and detailed description there of will be omitted. The semiconductor memory MEM of this embodiment has four banks BK1-4 each having a memory core 28. Further, four address control units 14, four address counters 22, four access detection units 24, and four array control units 26 are formed in correspondence to the banks BK1-4 respectively.

A mode register 12E has burst registers BUSTR and access registers ACSR corresponding to the banks BK1-4 respectively. An address input unit 18E has not only the function of the address input unit 18 of the first embodiment but also a function of receiving a bank address BA0-1 for the discrimination of the banks BK1-4. The bank address BA0-1 is supplied to the array control units 26. Each of the array control units 26 is activated according to the bank address BA0-1 to access a corresponding one of the banks BK1-4.

The other structure is the same as that of the first embodiment except that burst signals BUST1-4, access enable signals AINF1-4, addresses RA0-11, CA0-6, SA0-1 from the address counter 22, and detection signals DET1-4 are generated for the banks BK1-4 respectively. The tail numbers of the burst signals BUST1-4, the access enable signals AINF1-4, the detection signals DET1-4 correspond to the tail numbers of the banks BK1-4. That is, the semiconductor memory MEM is formed as a SDRAM having the four banks BK1-4. In this embodiment, the operations described in the first embodiment are executed for the banks BK1-4.

Pieces of the access enable information AINF1-4 are set separately for the banks BK1-4 or set collectively for all the banks BA1-4, according to a register set command supplied to a command input unit 10. Therefore, the command input unit 10 not only has the function of the command input unit 10 of the first embodiment but also receives the register set command (access enable information set command) including information indicating whether to set the access enable information AINF1-4 separately for the banks BK1-4 or collectively for all the banks BK1-4. This makes it possible to set the access enable information AINF1-4 according to the specifications of a memory controller (memory system) accessing the memory MEM.

In response to forced access requests FREQ1-4 supplied for the banks BK1-4 respectively, the array control units 26 forcibly activate sub-cell arrays SARY not corresponding to the access enable information AINF1-4 set in corresponding access registers ACSR (access information units).

The foregoing sixth embodiment can provide the same effects as those of the above-described first and second embodiments. In addition, in the memory MEM having the plural banks BK1-4, it is possible to access the sub-cell arrays SARY of the banks BK1-4 with minimum power consumption without lowering access efficiency.

Incidentally, the above embodiments describe the examples where the memory system is formed as the SIP. The present invention is not limited to such embodiments. For example, the memory system may be formed as a system LSI (SOC; System On Chip) integrated on a silicon substrate, or the memory system may be formed by mounting the CPU, the memory MEM, the flash memory FLASH, and the memory controllers MCNT1-2 on a printed-wiring board.

The above embodiments describe the examples where the embodiments are applied to the SDRAM. This is not restrictive, and the embodiments may be applied to, for example, a DRAM, a pseudo SRAM, an SRAM, a flash memory, or the like. The pseudo SRAM is a memory having memory cells of a DRAM, having the same input/output interface as that of an SRAM, and internally and automatically executing a refresh operation of the memory cells. A semiconductor memory to which the present invention is applied may be of a clock asynchronous type or of a clock synchronous type.

The above-described embodiments may be applied to a semiconductor memory MEM having sub-cell arrays SARY in number equal to 2 to the power of n (n: an integer equal to three or more) such as eight, sixteen, or thirty two. At this time, the number of bits of the array selection address necessary for discriminating the sub-cell arrays SARY is n. Further, the second-fifth embodiments may be applied to a semiconductor memory MEM having a plurality of banks BK.

A proposition of the embodiments is to access cell arrays with minimum power consumption without lowering access efficiency.

According to another aspect of the embodiments, when accesses to the plural cell arrays are continuously executed, an access detection unit detects in advance that access to the cell array not corresponding to the access enable information will be executed following access to the cell array corresponding to the access enable information. In response to the detection of the access detection unit, an array control unit forcibly activates the cell array not corresponding to the access enable information to execute an access operation. For example, the semiconductor memory has an address counter which operates in a burst access mode to sequentially generate internal access addresses following an external access address supplied from the exterior of the semiconductor memory. The access detection unit executes a detecting operation based on the external access and the internal access address. When the access operation of the cell array to which access is not permitted is executed by continuous accesses, information to that effect is detected in advance, which makes it possible to continuously execute the accesses without interruption. The cell array to which the access is not permitted is activated in response to the detection of the access detection unit. Therefore, it is possible to access the cell arrays with minimum power consumption without lowering access efficiency.

According to another aspect of the embodiment, when accesses to the plural cell arrays are continuously executed, upon detecting that the access to the cell array not corresponding to the access enable information will be executed, the access detection unit outputs a detection signal to an exterior of the semiconductor memory via a detection terminal. That is, when an access operation of the cell array to which the access is not permitted is to be executed, this notification is transmitted to a controller. In response to the detection signal, a control unit of the controller accessing the semiconductor memory determines whether to execute or stop the access operation of the cell array not corresponding to the access enable information of the semiconductor memory. For example, when the access operation of the cell array not corresponding to the access enable information is a malfunction, the controller stops the access operation. Consequently, a useless access is stopped. When the access operation of the cell array not corresponding to the access enable information is a normal operation, the controller continues the access operation. At this time, the cell array not corresponding to the access enable information is activated in response to the detection of the access detection unit. Therefore, it is possible to access the cell arrays with minimum power consumption without lowering access efficiency.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:

a plurality of cell arrays that includes memory cells and assigned different addresses;

an access information unit that stores access enable information indicating a number of the cell arrays to be simultaneously activated; and an array control unit that activates at least one of the cell arrays corresponding to the access enable information set in the access information unit, in response to an access request when a forced access request is not received from an exterior of the semiconductor memory, and forcibly activates at least one of the cell arrays indicated by an address supplied with the forced access request irrespective of the access enable information set in the access information unit, when the forced access request is received.

2. The semiconductor memory according to claim 1, further comprising an access detection unit which detects in advance that access to one of the cell arrays not corresponding to the access enable information is executed following access to one of the cell arrays corresponding to the access enable information, when accesses to the cell arrays are continuously executed, wherein the array control unit forcibly activates one of the cell arrays not corresponding to the access enable information in response to a detection of the access detection unit to execute an access operation.

3. The semiconductor memory according to claim 2, further comprising an address counter operating during a burst mode in which the memory cells are accessed and generating internal access address subsequent to an external access address, wherein the access detection unit executes a detecting operation based on the external access address and the internal access address during the burst mode.

4. The semiconductor memory according to claim 2, further comprising a detection terminal outputting a detection signal indicating that the access operation of one of the cell arrays not corresponding to the access enable information is executed in response to the detection of the access detection unit.

5. The semiconductor memory according to claim 1, further comprising a command input unit receiving an access command for accessing the memory cells and receiving the forced access request as a command, wherein the array control unit forcibly activates at least one of the cell arrays not corresponding to the access enable information, in response to the forced access request received at the command input unit.

6. The semiconductor memory according to claim 1, further comprising a forced access request terminal receiving the forced access request, wherein the array control unit forcibly activates at least one of the cell arrays not corresponding to the access enable information, in response to the forced access request received at the forced access request terminal.

7. The semiconductor memory according to claim 1, further comprising a command input unit receiving an access command for accessing the memory cells, and receiving the access enable information as a register set command, wherein the access information unit is set according to the register set command.

8. The semiconductor memory according to claim 7, wherein the access information unit is set according to at least one of an address and data supplied to external terminals in accordance with the register set command.

9. The semiconductor memory according to claim 1, wherein the access information unit includes a fuse circuit in which the access enable information is programmed.

10. The semiconductor memory according to claim 1, wherein:

the access information unit includes a switch having a conductive pattern which is formed on a substrate of the semiconductor memory so as to match a pattern shape of a photo mask used in a semiconductor manufacturing process; and the switch sets the access enable information indicating the number of the cell arrays to be simultaneously activated, according to a voltage value of a coupling destination of the conductive pattern.

11. The semiconductor memory according to claim 1, further comprising a plurality of banks each having the cell arrays and each operating independently of one another, wherein:

the access information unit holds the access enable information for the cell arrays of each of the banks; and the array control unit is provided for each of the banks, and in response to the forced access request supplied for each of the banks, forcibly activates at least one of the cell arrays not corresponding the access enable information set in the access information unit.

12. The semiconductor memory according to claim 11, further comprising a command input unit receiving an access command for accessing the memory cells, and receiving the access enable information as a register set command, wherein the register set command includes information indicating whether to set the access enable information separately for each of the banks or collectively for all the banks.

13. A memory system comprising a semiconductor memory and a controller accessing the semiconductor memory, wherein the semiconductor memory comprises:

a plurality of cell arrays having memory cells and assigned different addresses;

an access information unit in which access enable information indicating a number of the cell arrays to be simultaneously activated is set;

an access detection unit which detects in advance that access to one of the cell arrays not corresponding to the access enable information is executed following access to one of the cell arrays corresponding to the access enable information, when accesses to the cell arrays are continuously executed; and an array control unit which activates at least one of the cell arrays corresponding to the access enable information set in the access information unit, in response to an access request, and forcibly activates at least one of the cell arrays not corresponding to the access enable information set in the access information unit, in response to a detection of the access detection unit; and a detection terminal outputting a detection signal indicating that an access operation of one of the cell arrays not corresponding to the access enable information is executed, to an exterior of the semiconductor memory in response to the detection of the access detection unit; and wherein the controller includes a control unit which determines whether to execute or stop the access operation of one of the cell arrays not corresponding to the access enable information of the semiconductor memory, in response to the detection signal.

* * * * *